United States Patent [19]

Dieulesaint et al.

[11] Patent Number: 4,706,046

[45] Date of Patent: Nov. 10, 1987

[54] RESONATOR MADE OF NONPIEZOELECTRIC MATERIAL WITH HIGH QUALITY COEFFICIENT

[75] Inventors: Eugène J. Dieulesaint, Saint-Maur; Daniel R. Royer, Sainte-Genevieve des Bois, both of France

[73] Assignee: Etat Francais as represented by the Deleque General pour l'Armement, France

[21] Appl. No.: 866,351

[22] Filed: May 23, 1986

[30] Foreign Application Priority Data

May 30, 1985 [FR] France ................................ 85 08087

[51] Int. Cl.⁴ .............................................. H03B 5/30
[52] U.S. Cl. .................................... 331/155; 331/156; 250/232
[58] Field of Search ............ 331/65, 155, 156, 116 M; 73/862.59; 250/232; 333/200

[56] References Cited

U.S. PATENT DOCUMENTS

| 3,019,397 | 1/1962 | Cosby | 331/65 |
| 3,327,121 | 6/1967 | Thomas | 331/155 X |
| 3,805,190 | 4/1974 | Berlin et al. | 331/156 X |
| 4,567,451 | 1/1986 | Greenwood | 331/155 |

Primary Examiner—Eugene R. LaRoche
Assistant Examiner—Robert J. Pascal
Attorney, Agent, or Firm—Parkhurst & Oliff

[57] ABSTRACT

The resonator (10) includes a monocrystal (11) of a nonpiezoelectric material with low attenuation of elastic bulk waves, such as corundum, means of supporting the monocrystal fastened to the monocrystal at points corresponding to the vibration nodes, thermal means (40) for directly causing a proper excitation of the monocrystal (11) and optical means (50) for detecting the periodic motion of the resonator without contact. Application in particular in oscillator construction.

14 Claims, 5 Drawing Figures

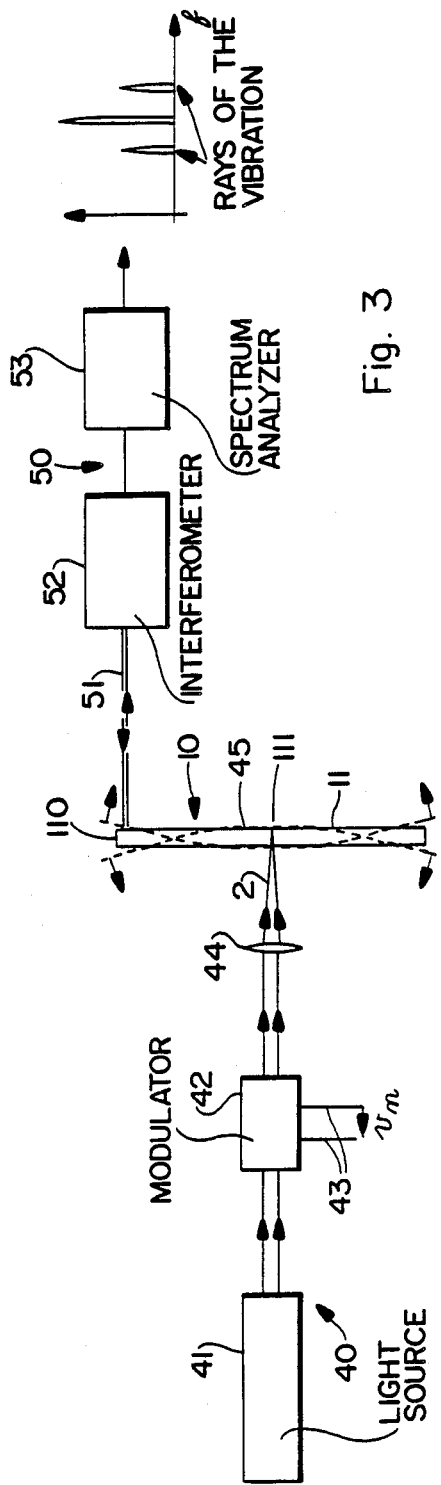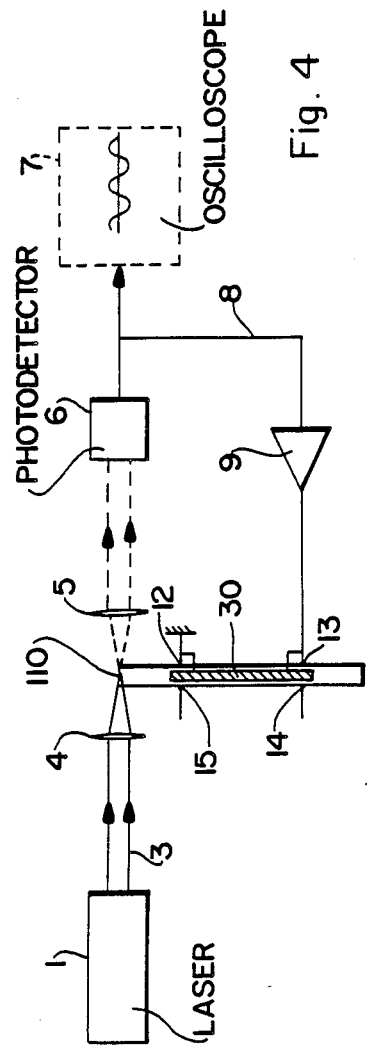
Fig. 3
Fig. 4

RESONATOR MADE OF NONPIEZOELECTRIC MATERIAL WITH HIGH QUALITY COEFFICIENT

Quality resonators today are made of piezoelectric material, in particular single-crystal quartz. These bulk-wave resonators essentially consist of a quartz crystal with a crystallographic cut and appropriate shapes (rod of rectangular section, plate, blade, etc) secured at selected points to vibrate preferentially in a given mode (bending, elongation, contour mode, shear, etc.). They are set into vibration by a voltage applied between electrodes that are placed either on the crystal itself or in the immediate vicinity.

Such known resonators of the piezoelectric type are found to be convenient to use because the resonator can be excited mechanically by applying an electric voltage and conversely its vibration can be detected by measuring the induced electric voltage, but the attenuation coefficient of the elastic waves depends on the material used.

Moreover, for many applications, it is desirable to have a resonator of very high quality.

Accordingly, the purpose of the invention is to construct a very high quality resonator that can be excited and whose vibration frequency can be measured without disturbing the operation of the resonator.

These goals are achieved with a resonator made of a nonpiezoelectric material of high quality coefficient, wherein the resonator includes a monocrystal of a nonpiezoelectric material with a low attenuation of bulk elastic waves, means for supporting the single crystal that are fastened to the crystal at points corresponding to vibration modes, thermal means for directly causing a proper excitation of the monocrystal, and optical means for detecting the periodical movements of the resonator without contact.

According to one embodiment, the single crystal is in the form of a rod vibrating in bending mode.

Other shapes, such as plates, blades or disks, are of course possible for the monocrystal.

According to one particular embodiment that is simple to construct, the optical means for detecting the periodic motion of the resonator includes a light source emitting a beam of lens, a first lens to converge the beam onto a vibrating part of the monocrystal perpendicular to the direction of vibrations, a second lens receiving the beam affected by the motion of the monocrystal, and a photodetector to detect the resonator vibrations.

According to another particular embodiment, the optical means for detecting the motion of the resonator includes an interferometric device with a spectrum analyzer, with the beam from the interferometric device being applied to the vibrating part of the crystal parallel to its direction of vibration.

Various means are possible for exciting the crystal.

According to one particular means, at least a thin layer of conducting material is deposited in the form of tape on one face of the monocrystal, wires are connected to this layer at the crystal vibration nodes and a periodic electric voltage is applied between the the wires to excite the crystal by Joule effect.

The conductive layer consists of a thin layer of a metal such as chromium or nickel, deposited by vacuum evaporation or cathode sputtering.

According to another embodiment, the means directly causing a proper excitation of the monocrystal includes a source of light and modulation means to which a modulation voltage $v_m$ is applied, to send a light beam with modulated heat intensity into a vibration zone of the crystal and to insure a proper excitation of the crystal by photothermal effect.

Advantageously, the monocrystal is made of alumina ($Al_2O_3$), also called corundum.

However, other materials can be used such as YAG (yttrium-aluminum-garnet) or YIG (yttrium-iron-garnet).

BRIEF DESCRIPTION OF THE DRAWING

Further advantages and features of this invention will be apparent from the following detailed descriptions of several embodiments of this invention with reference to the corresponding accompanying drawings in which:

FIG. 3 is a diagram of a second device for detecting a signal representing the vibration of a resonator according to the invention, along with the diagram of the excitation device by photothermal effect;

FIG. 4 is the diagram of an example of a resonator according to the invention used as an oscillator.

DESCRIPTION OF THE PREFERRED EMBODIMENTS

Figure 1:
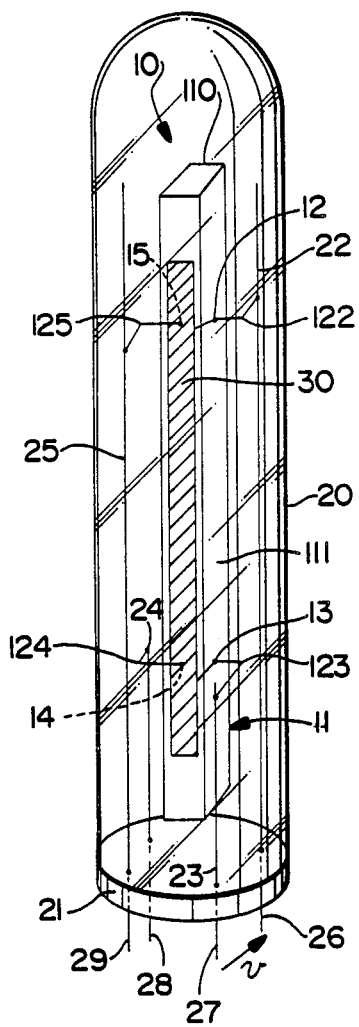
FIG. 1 is a schematic perspective view of a resonator made from a bar of nonpiezoelectric material and excited in a bending mode by Joule effect.
Figure 5:
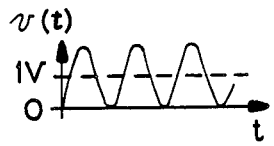
FIG. 5 shows the shape of an excitation signal that can be applied to the resonator in FIG. 1.

FIG. 1 gives an example of resonator 10 according to the invention that is enclosed in a glass bulb 20 inside of which the pressure is lowered. A monocrystal 11 of nonpiezoelectric material with high quality coefficient, such as a monocrystal of alumina or of yttrium-aluminum-garnet (YAG) or yttrium-iron-garnet (YIG) is cut to the shape of an elongated bar 11 supported by four rods 22 to 25 forming columns fastened on an insulating base 21, for example made of glass. The rods 22 to 25 extend outside the bulb 20 by pins 26 to 29, respectively. Bar 11 is connected to rods 22 to 25 by elbow wires 122 to 125, respectively, which are soldered to the corresponding rods 22 to 25 on the one hand and to bar 11 on the other hand, at points 12 to 15, which are vibration nodes.

A conductive layer 30, for example a thin layer of chromium or nickel, is deposited by vacuum evaporation or cathode sputtering on one face of the bar 11. The conductive layer 30 is electrically in contact by its end points at two points 12, 13 connecting it to support rods 22 to 23 that also serve as connection wires for applying a periodic electrical voltage between the two ends of the conductive layer 30 which, by Joule effect, excite the bar 11 according to a bending mode in the example considered, as long as the electric voltage v applied between pins 26, 27 connected to rods 22, 23 is periodic and a frequency that corresponds to the frequency of crystal 11.

In the embodiments described hereafter, the case is considered of a resonator 10 made from a rod such as in FIG. 1, which can have for example a cross section of a few square millimeters and a length of a few tens of millimeters. The crystal 11, however, could have other shapes, for example that of a disk, like piezoelectric crystal resonators.

FIG. 3 shows a variation of the embodiment of thermal means 40 exciting a vibrating part 111 of the crystal 11. According to this embodiment, a light beam produced by a source 41 is modulated by a modulator 42 to which an electric modulation voltage $v_m$ is applied on the lines 43. The modulated excitation light beam 2 from the modulator 42 is applied through a length 44 to an absorbing zone of crystal 11 and, by photothermal effect, causes a periodic dilatation of the crystal which, if the frequency of the excitation signal $v_m$ corresponds to the frequency of the crystal 11, makes the crystal 11 resonate. The excitation effect of the crystal 11 can be increased if an absorbing layer 45 is deposited on one face of the monocrystal 11 in the zone of incidence of the modulated light beam 2.

If the light source 41 is a laser, the modulator 42 can be an acousto-optic modulator. However, if the light source 41 is a laser diode, the modulation means 42 may be constituted directly by means of modulating the voltage applied to the laser diode. Furthermore, it is preferable that the exciting beam 2 be applied to a limited area of the crystal 11, but this area is not necessarily a point.

Figure 2:
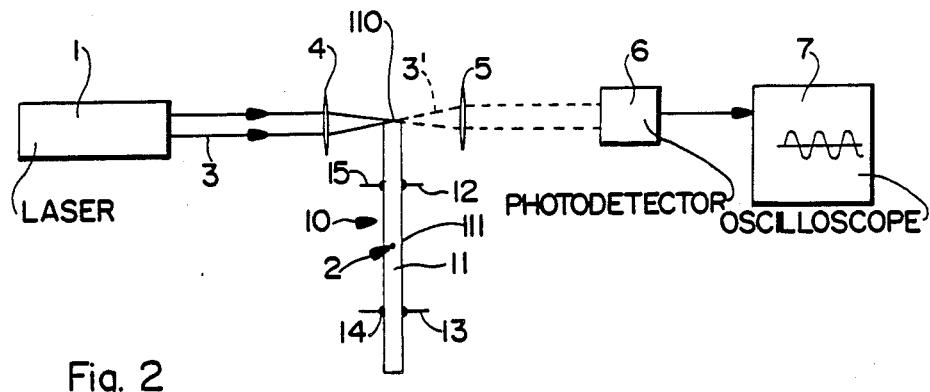
FIG. 2 is a diagram of a first device for detecting a signal representing the vibration of a resonator according to the invention.

FIG. 2 shows the scheme of a resonator 10 according to the invention, excited by a light beam 2 applied at a zone 111 of the crystal 11 according to the direction of the vibrations to be produced, i.e. perpendicular to the plane of the figure. The crystal 11 is shown symbolically and only the connection points 12 to 15 by which the crystal 11 is attached to the support are shown. These points correspond to vibration nodes.

In FIG. 2, we see a detection device including a light source 1 such as a laser source 1 emitting a light beam 3 that is applied to a lens 4 on a vibrating part 110 of the crystal 11 perpendicular to the direction of the vibration. The light beam 3 affected by the vibration of the crystal 11 is collected in lens 5 and applied to a photodetector 6 delivering a signal that can be observed on a oscilloscope 7 and represents the vibration of the crystal. These optical means of detecting the vibration signal are thus particularly simple.

Other optical means can be used to detect the vibration of the crystal 11. Accordingly, in FIG. 3, an interferometer 52 is used that emits a detector beam 51 in the direction of the vibrating part 110 of the crystal 11. The beam 51 in the direction of the vibrating part 110 of the crystal 11. The beam 51 is reflected back on itself and is thus phase-modulated by the periodic motion of the crystal perpendicular to the direction of the beam 51 (refer to the bending deformation of the crystal 11 shown in dotted lines in FIG. 3). The optical detection device 50 also includes a spectrum analyzer 53 to determine the lateral rays of vibration corresponding to the eigen-frequency of vibration of the crystal 11, as long as the interferometer 52 used is a heterodyne interferometer.

In the cases of the devices in FIGS. 2 and 3, the excitation device 40 can of course be replaced by a Joule effect excitation device using a conductive tape 30 expanding periodically at the frequency of the excitation voltage v, which corresponds to the resonance frequency of the bending modes as can be seen by referring to FIG. 1.

FIG. 4 shows a resonator 10 analogous to the one in FIG. 2, but excited by the Joule effect and arranged in a loop circuit that constitute an oscillator. In this case, the electrical signal from the photodetector 6 is reapplied through line 8 to the input of an amplifier 9 whose output supplies the modulation voltage v applied to the electrodes of the conductive tape 30.

The conductive tapes 30 can of course be configured differently to adapt to a given shape of the crystal 11. In the case of a bar, it would be possible to use two conductive tapes 30 deposited on two faces opposite the crystal 11 and excited in phase opposition.

Similarly, for an excitation with a light beam that is partially absorbed in the crystal 11 (FIGS. 2 and 3), zero-order beams and beams not coming from an acousto-modulator 42 can be used that are in phase opposition. In this case, the beams are applied to two opposite faces of the crystal 11.

As an example, it is possible to obtain vibrations having an amplitude of the order of 50 to 100 nanometers with an electrical power of some 10 mW in the case of the Joule effect excitation, or a light power of some 20 mW in the case of a photothermal effect excitation, if the excitation signal frequency corresponds to the resonance frequency of the crystal in bending mode.

The excitation means of nonpiezoelectric crystal resonators described above in the bending mode can similarly be applied to exciting other modes, in particular elongation, contour mode, shear.

What we claim is:

1. A resonator of nonpiezoelectric material with a high quality coefficient comprising: a monocrystal of nonpiezoelectric material with a low attenuation of bulk elastic waves, means for supporting the monocrystal attached to the monocrystal at points corresponding to vibration nodes, thermal means for directly causing an excitation of the monocrystal at the natural frequency of the monocrystal and optical means for detecting periodic motions of the resonator without mechanical contact with the resonator.

2. A resonator as claimed in claim 1 wherein the said monocrystal has the form of a rod vibrating in a bending mode.

3. A resonator as claimed in claim 1, wherein the optical means of detecting the periodic motions of the resonator comprise a light source emitting a beam, a first lens to converge the beam onto the vibrating part of the monocrystal perpendicular to the direction of the vibrations, a second lens receiving the beams affected by the motion of the monocrystal and a photodectector to detect the vibrations of the resonator.

4. A resonator as claimed in claim 1 wherein the optical means of detecting the periodic motions of the resonator comprise an interferometric device associated with a spectrum analyzer, with a beam of the interferometric device applied to the vibrating part of the crystal parallel to the direction of crystal vibration.

5. A resonator as claimed in any one claim 1, wherein at least a thin layer of conductive material is deposited in the form of tape on one face of the monocrystal, connection wires are connected to the said layer at the crystal vibration modes and a periodic electrical voltage is applied between the connection wires to excite the crystal by Joule effect.

6. A resonator as claimed in claim 5, wherein the conductive layer comprises a thin layer of a metal selected from the group consisting of chromium and nickel.

7. A resonator as claimed in claim 5, wherein the periodic electrical voltage oscillates continuously between a peak value and zero, to excite the crystal at a fundamental frequency of the electrical voltage.

8. A resonator as claimed in claim 1, wherein the means directly causing a proper excitation of the monocrystal includes a light source and modulation means to which is applied a modulation voltage $v_m$ to apply a light beam with modulated intensity in a vibration zone of the crystal and to ensure a proper excitation of the crystal by photothermal effect.

9. A resonator as claimed in claim 8, wherein an absorbing layer is deposited on one face of the monocrystal in an area receiving the incident modulated light beam.

10. A resonator as claimed in claim 1, wherein the monocrystal is enclosed in a glass bulb with reduced pressure inside.

11. A resonator as claimed in claim 1, wherein the monocrystal is made of alumina.

12. A resonator as claimed in claim 1, wherein the monocrystal is of the YAG type.

13. A resonator as claimed in claim 1, wherein the monocrystal is of the YIG type.

14. An oscillator comprising:
   a resonator of nonpiezoelectric material having a high quality coefficient comprising a monocrystal of nonpiezoelectric material with a low attenuation of bulk elastic waves;
   means for supporting the monocrystal attached to the monocrystal at points corresponding to vibration nodes;
   thermal means, responsive to an electrical modulation voltage, for causing an excitation of the monocrystal at the natural frequency of the monocrystal; and
   optical means for detecting periodic vibration of the resonator without mechanical contact with the resonator, and for producing an output signal according to the periodic vibration;
   wherein the electrical modulation voltage applied to the thermal means is supplied by an amplifier receiving the output signal from the optical means.

* * * * *